(12) United States Patent
Singer et al.

(10) Patent No.: US 6,396,429 B2
(45) Date of Patent: May 28, 2002

(54) FRONT-END SAMPLING FOR ANALOG-TO-DIGITAL CONVERSION

(75) Inventors: Lawrence A. Singer, Bedford; Iuri Mehr, North Andover, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/756,306

(22) Filed: Jan. 8, 2001

Related U.S. Application Data

(60) Provisional application No. 60/175,027, filed on Jan. 7, 2000.

(51) Int. Cl.[7] ............................................. H03M 1/12
(52) U.S. Cl. ........................................ 341/155; 341/161
(58) Field of Search .................. 341/161, 143, 341/156, 120, 155, 172

(56) References Cited

U.S. PATENT DOCUMENTS

| | | | | |
|---|---|---|---|---|
| 5,043,732 A | * | 8/1991 | Robertson et al. | 341/156 |
| 5,416,485 A | * | 5/1995 | Lee | 341/172 |
| 5,760,722 A | * | 6/1998 | Harris et al. | 341/143 |
| 5,982,313 A | * | 11/1999 | Books et al. | 341/143 |
| 5,990,820 A | * | 11/1999 | Tan | 341/161 |
| 6,195,032 B1 | * | 2/2001 | Watson et al. | 341/162 |
| 6,222,478 B1 | * | 4/2001 | Bright | 341/162 |
| 6,323,800 B1 | * | 11/2001 | Chiang | 341/161 |

\* cited by examiner

*Primary Examiner*—Michael Tokar
*Assistant Examiner*—Jean Bruner Jeanglaude
(74) *Attorney, Agent, or Firm*—Wolf, Greenfield & Sacks, P.C.

(57) ABSTRACT

An analog-to-digital converter including a quantizer and a residue generator, both of which sample an input voltage in parallel. The sampling characteristics of each of the residue generator and the quantizer are designed to substantially match one another. This converter may be used as a low-power ADC front-end circuit that does not require a dedicated sampleand-hold circuit. The front-end circuit consists of two substantially-matched sampling networks, one for the residue generator and the other for the quantizer, inside the first stage of the converter.

12 Claims, 9 Drawing Sheets

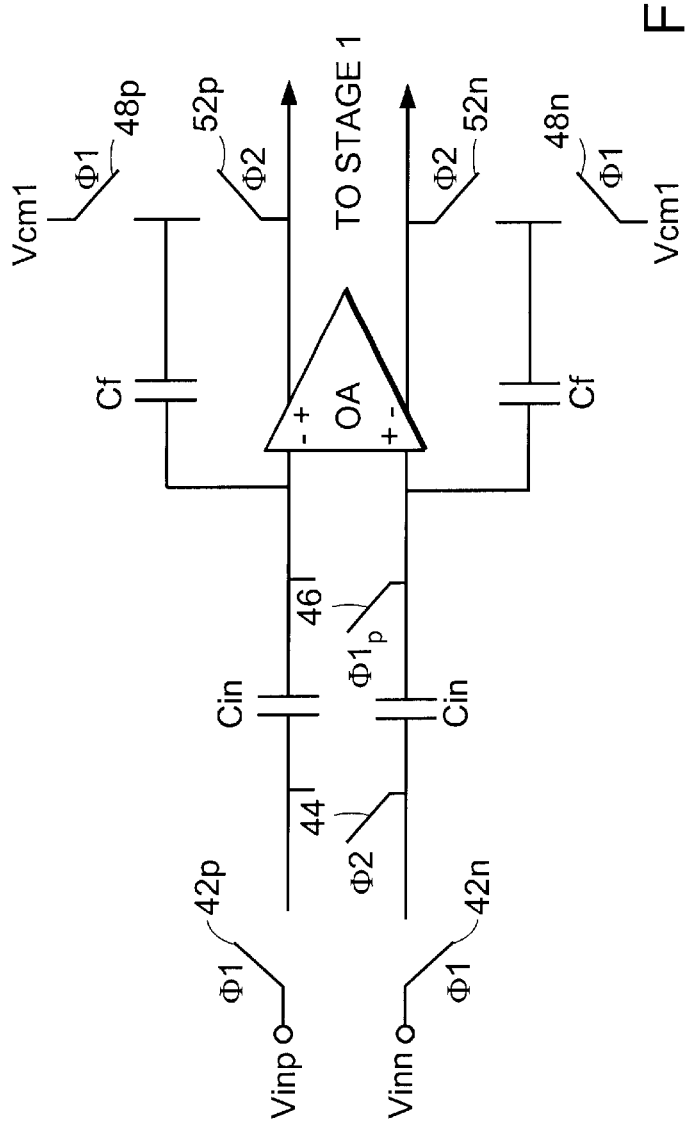
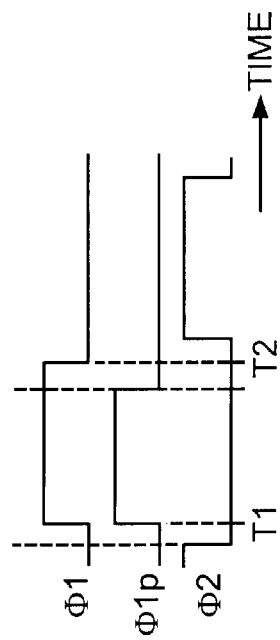
FIG. 3A
FIG. 3B

FRONT-END SAMPLING FOR ANALOG-TO-DIGITAL CONVERSION

CROSS REFERENCE TO RELATED APPLICATION

This is a non-provisional application claiming priority under 35 U.S.C.§119(e) from Provisional Application Ser. No. 60/175,027 filed Jan. 7, 2000 in the names of Lawrence Singer and Iuri Mehr.

FIELD OF THE INVENTION

This invention relates to analog-to-digital converters and, more particularly, to the sampling mechanism for the front-end of a converter, particularly a converter using a pipelined architecture and which is preferably implemented in CMOS technology.

BACKGROUND OF THE INVENTION

Analog-to-digital converters (also called A/D converters or ADCs) are ubiquitous building blocks of electronic systems which process physical signals from transducers or electronic signal generating circuits. Among the many applications which employ ADC's are applications such as wireless receivers and ultrasound systems, wire line interfaces, cameras and camcorders, all of which make use of ADC's having typically about 10-bit resolution and sampling rates at around 40 MHz. Most of them require low power consumption as well as low noise, and many of them require high dynamic performance using Nyquist or higher input frequencies. Modem CMOS technology provides the opportunity for implementing medium resolution (i.e., about 8–12 bit) ADC's that are able to fulfill the requirements of such applications. However, achieving good dynamic performance for high input frequencies has proved to be a difficult task. Nyquist rate ADC's that operate at high frequencies with reasonable power consumption have mainly been implemented using BiCMOS technology and only recently are becoming accessible in CMOS. A need exists, therefore, for an ADC of such resolution that features low power consumption combined with good dynamic performance.

For applications such as those identified above, the list of design requirements for an ADC is topped by a low power Nyquist rate (and above) implementation suitable for CMOS fabrication. Also, there is a need to preserve good linearity and low noise such that the converter exhibits substantially full resolution for input frequencies well beyond Nyquist. A specific challenge is provided by virtue of the aforementioned requirements often conflicting. For example, low power conflicts with high speed operation.

There are quite a few architectures which could be used to implement high-resolution (i.e., 10-bit or greater) ADC. However, straight flash topologies are impractical from a power (as well as area) perspective. Also, successive approximation (or cyclic) topologies are not practical for high speed Nyquist rate operation. Folding and/or interpolating (averaging) topologies have been successfully used. They exhibit low power due mostly to interpolation, and low latency (i.e., delay from input to the output); however, they do not excel regarding dynamic performance and are more suited to bipolar than to CMOS implementations. Pipeline architectures are known to use less power than the other named architectures, but at the expense of conversion latency. In pipeline converters, power consumption can be optimized by an appropriate selection of bits per stage and capacitor scaling down the pipeline. Also, pipeline architectures are successfully implemented in CMOS using switched capacitor designs which make them easy to integrate. Speed can be improved through the use of various parallel blocks through the pipeline, although usually at the expense of higher power consumption and less impressive dynamic performance for high input frequencies.

Turning to FIG. 1, there is depicted a block diagram for a first typical architecture for a residue stage of a typical prior art pipelined ADC 10. An input signal Vin is applied at input node 12. Within the stage, this node is connected to the input of a quantizer 14 and a (usually switched-capacitor) residue generator 16. The quantizer is typically an analog-to-digital converter such as a flash converter. The output of the quantizer 14 is a digital representation of the input signal, usually of only a few bits resolution. A DAC 18 in the residue stage generates a corresponding analog signal representing the quantizer output, and supplies this analog signal to a summer 22. At substantially the same time as the quantizer samples the analog input signal in response to a clock signal applied at 24, a sample-and-hold (S/H) circuit 26 acquires and holds a sample of the input signal and supplies that held value to the summer 22. Summer 22 forms a difference signal representing the difference between the sampled input signal from the S/H circuit and the approximated input signal reproduction at the output of DAC 18. The resulting difference, or error, signal at 28 is preferably amplified by an amplifier 30 to scale the output residue signal at 32 to take advantage of the dynamic range of the next stage in the pipeline.

The accuracy of the residue generation (and, thus, the whole converter) is highly dependent, of course, on the S/H circuit and the quantizer sampling the input signal at the same time. If there is too large a difference in the timing of those samples, then the residue signal ceases to represent the difference between the input signal at an instant and the ability of the quantizer and DAC to reproduce that input signal value. Hence the next stage will be presented with an error signal beyond its range of ability to correct for the initial conversion inaccuracy.

Due to that problem, or limitation on performance, in order to capture high-frequency input signals, most converters, including pipeline ADC's, make use of a front-end S/H circuit, as shown in FIG. 2. There, a S/H circuit 34 has been added between the input signal and node 12. S/H circuit 34 is clocked (i.e., takes its sample) half a clock cycle from S/H circuit 26 and quantizer 14. With this arrangement, input to the node 12 is not moving when it is sampled, so there is no risk that the quantizer and residue stage will sample different values of the waveform. However, S/H circuit 34 requires significant power. Also, inasmuch as the output of the S/H circuit 34 is what is sampled by the quantizer, the S/H circuit 34 may be viewed as a potentially significant source of input-referred noise which can be amplified by, and limit the noise performance of, the whole converter. FIG. 3A presents such a typical prior art S/H circuit, the switches of which are operated by the control signals shown in FIG. 3B, the individual control signal which operates a switch being labeled next to the switch and a switch being closed when its control signal is asserted as a logical high value. Initially, at a time T1, switches $42_p$, $42_n$, 46, $48_p$ and $48_n$ are closed and switch 44 is open. This is know as the track phase. The input voltage (shown here as a differential input Vinp–Vinn) is sampled on capacitors Cinp and Cinn at the end of the tracking phase at T2 (i.e., when Φ1p and then Φ1 is de-asserted). During the hold phase which occurs next (with Φ1 de-asserted and Φ2 asserted), switches $42_p$, $42_n$, 46, $48_p$ and $48_n$ are open, switches 44, 52$_p$ and 52$_n$ are closed and the charge from the sampling capacitors Cinp and Cinn is transferred to corresponding feedback capacitors Cfp and Cfn from capacitors Cinp and Cinn such that each of the output voltages is a scaled copy of the corresponding sampled input voltage. Note that this circuit can accommodate single-ended inputs, too, or, in general, a large input comrnmon-mode range, as opposed to the "flip-around" type of SHA such as that shown in S. Sutarja and P. R. Gray, "A pipelined 13-bit, 250-ks/s, 5V analog-to-digital converter," *IEEE J. Solid-State Circuits*, vol. 23, no. 5, pp 1316–1323, December 1988. Also, this circuit can provide voltage gain.

SUMMARY OF THE INVENTION

The above-identified and other needs are met according to the present invention, by a converter architecture which avoids the use of a dedicated input sample-and-hold amplifier (SHA) (or sample-and-hold circuit or network, those terms being used interchangeably herein) by distributing the sampling operation such that it resides in both a quantizer and a residue generator. The residue generator and the quantizer sample an input voltage in parallel. The sampling characteristics of each of the residue generator and the quantizer are designed to substantially match one another. The degree of matching of the sampling characteristics depends on the expected frequency of the input voltage. For a greater input voltage frequency, the degree of matching required is higher.

Such a quantizer may, for example, employ either a single SHA and ADC or in the event the ADC is a flash converter, instead of a single SHA there may be provided one S/H circuit associated with each comparator in the flash converter.

This architecture may be used stand-alone or as a first stage of a pipeline converter. That stage (and all subsequent stages except for the last stage) includes, in one embodiment, both a quantizer and a residue generator.

One embodiment of the invention thus is directed to a pipeline converter with a low-power ADC front-end circuit that does not require a dedicated sample-and-hold circuit. The front-end circuit consists of two substantially-matched sampling networks, one corresponding to a residue generator, and the other directed to a flash comparator (the quantizer), inside of the first stage of the converter.

The lack of a dedicated front-end sample-and-hold circuit for both the residue circuit and the quantizer reduces power consumption and input-referred noise. By substantially matching the sampling characteristics of the two networks (i.e., that of the quantizer and that of the residue generator), aperture errors resulting from the parallel sampling (by the two networks) of high frequency input signals are greatly reduced.

In accordance with a first aspect, the invention involves an analog-to-digital converter having an input to receive an input signal; a quantizer, coupled to the input, to sample the input signal; and a residue generator, coupled to the quantizer and adapted to separately sample the input signal. The sampling characteristics of the residue generator are selected to substantially match sampling characteristics of the quantizer. The degree of matching of the sampling characteristics may be selected at least in part based upon an expected frequency range of the input signal.

According to a second aspect, the invention involves a method of sampling an input voltage including using a quantizer, sampling the input voltage; and using a residue generator operatively connected to receive an output from the quantizer, and having sampling characteristics substantially matching sampling characteristics of the quantizer, also sampling the input voltage. The sampling characteristics may be matched at least in part based upon an expected frequency range of the input signal.

According to a third aspect, the invention involves an analog-to-digital converter, having a residue generator and a quantizer, each having a sampling network connected to sample a same analog input signal and the sampling networks having substantially matched sampling characteristics. An output from the quantizer is operatively connected to provide an input to the residue generator, and the residue generator is configured and arranged to generate a residue signal from the quantizer output and samples from the residue generator sampling network. The matched sampling characteristics may include the bandwidths of the sampling networks and/or sampling timing. The quantizer may include a flash converter having a plurality of comparators, each having one input connected to a respective threshold voltage and one input connected to an output of the quantizer sampling network; and the quantizer sampling network may comprise a sample-and-hold circuit for each of said comparators.

According to a fourth aspect, the invention involves a pipelined analog-to-digital converter comprising a first stage, one or more intermediate stages each of which receives as input a residue signal output from an immediately preceding stage, a final stage which converts a residue output signal from a next-to-final stage into a corresponding digital signal and correction logic which receives each stage's output and generates a corresponding digital word; and at least the first stage is an analog-to-digital converter as hereinabove described in connection with other aspects of the invention.

According to a still further aspect of the invention, an analog-to-digital converter having a residue generator may be provided with a quantizer; each of the residue generator and the quantizer may have a sampling network connected to sample a same analog input signal, with the sampling networks having substantially matched sampling characteristics such as bandwidth and timing. An output from the quantizer may be operatively connected to provide an input to the residue generator; and the residue generator may be being configured and arranged to generate a residue signal from the quantizer output and samples from the residue generator sampling network. Among the types of analog-to-digital converters which may employ this arrangement are (without limitation) pipeline converters, cyclic converters, pipeline sigma-delta converters, error-correcting successive approximation converters, and two-step converters.

BRIEF DESCRIPTION OF THE DRAWINGS

The invention will be more fully understood from the detailed description of illustrative implementations presented below, which should be read in conjunction with the accompanying drawings in which like elements are identified by like designations.

In the drawings:

FIG. 3A is simplified schematic circuit diagram for a typical sample-and-hold circuit for use in the stages of FIGS. 1 and 2;

FIG. 3B is a timing diagram for the waveforms driving the switches of FIG. 3A;

DETAILED DESCRIPTION

Figure 4:
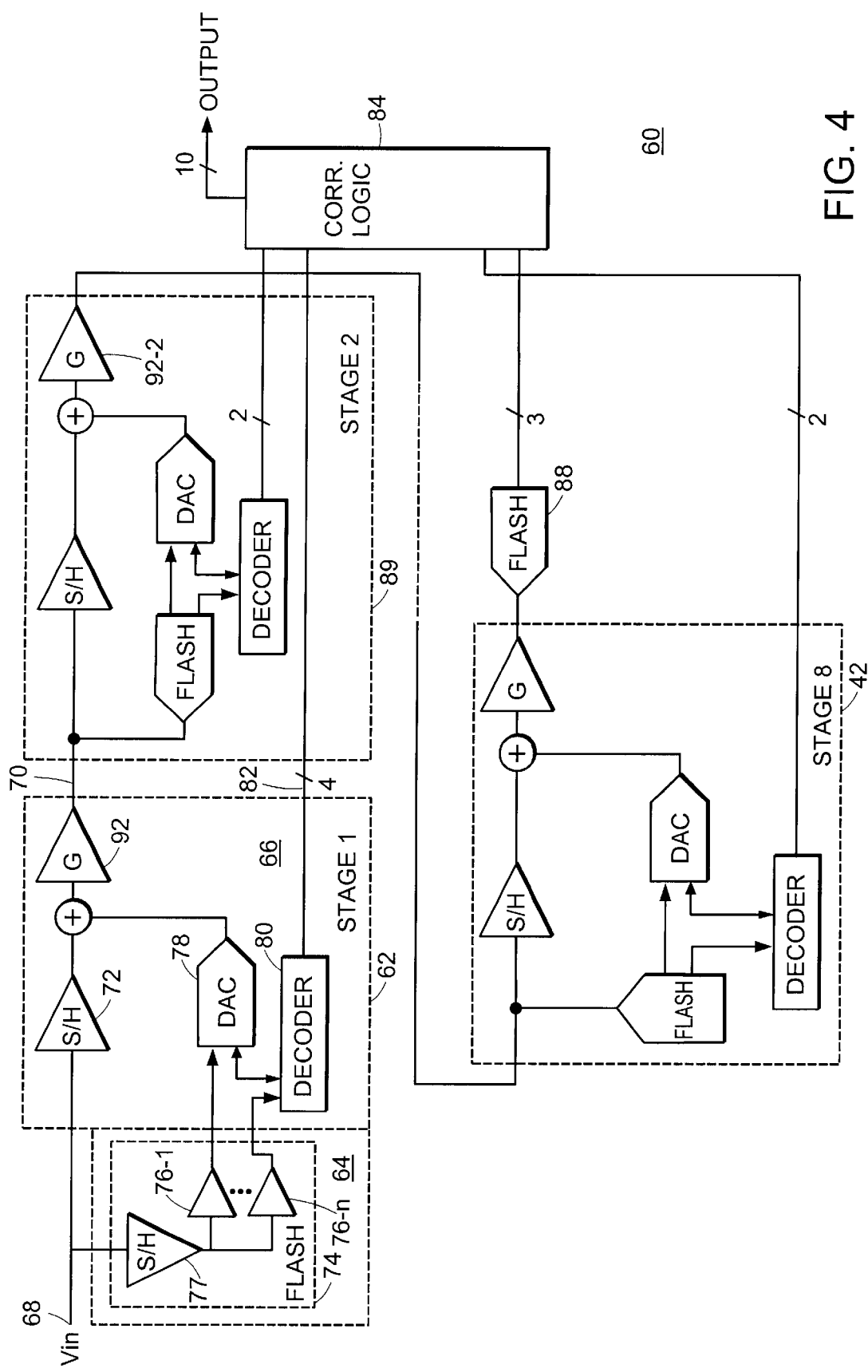
FIG. 4 is a block diagram of an exemplary ADC according to the invention.

FIG. 4 presents the architecture of an exemplary converter 60 utilizing the invention. In this example, an eight-stage pipelined converter is shown. Of course, the invention applies to the use of any appropriate number of stages (including just one) and any appropriate number of bits of resolution in the output digital word. A first stage 62 has a quantizer 64 and a residue generator 66. This first stage samples the analog input signal $V_{in}$ supplied at 68 and generates a residue signal at 70 for the next stage. Note that there is no SHA interposed between the analog input signal and the first stage of the pipeline converter. Typically, the dynamic performance of pipeline converters is limited at the front-end by the distortion and noise performance of such a SHA. This implies significant power consumption in the SHA in order to achieve the requirements for high input frequencies. The absence of the SHA saves power. However, since a sampling operation is still needed, the sampling operation is distributed inside first stage 62 to both the residue generator and the quantizer. A net power savings still results, despite adding a sampling operation to the quantizer. Moreover, the sampling associated with the quantizer need only be as accurate as the quantizer. For example, if a 4-bit quantization is performed, the quantizer S/H 77 need only be 4-bit accurate.

Figure 1:
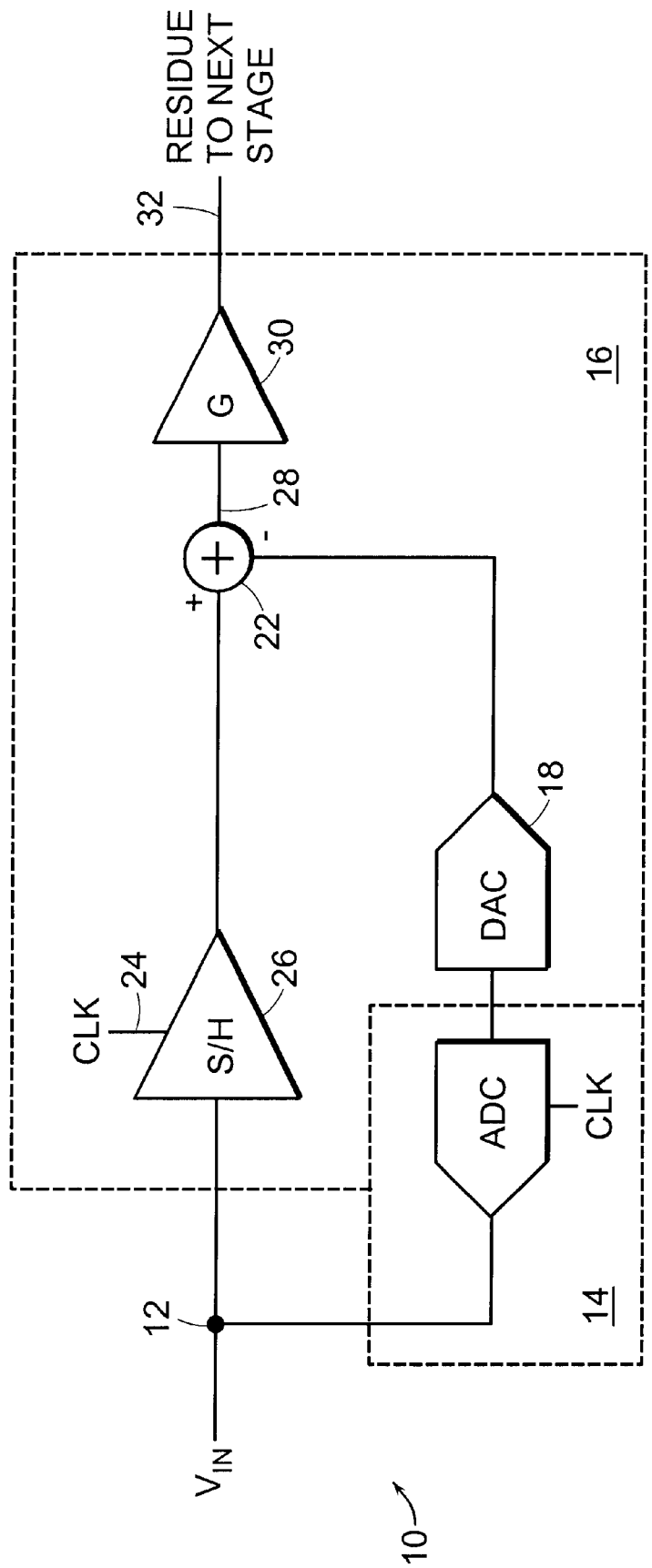
FIG. 1 is a block diagram of a first type of prior art architecture for a residue stage of a typical prior art pipelined ADC.
Figure 2:
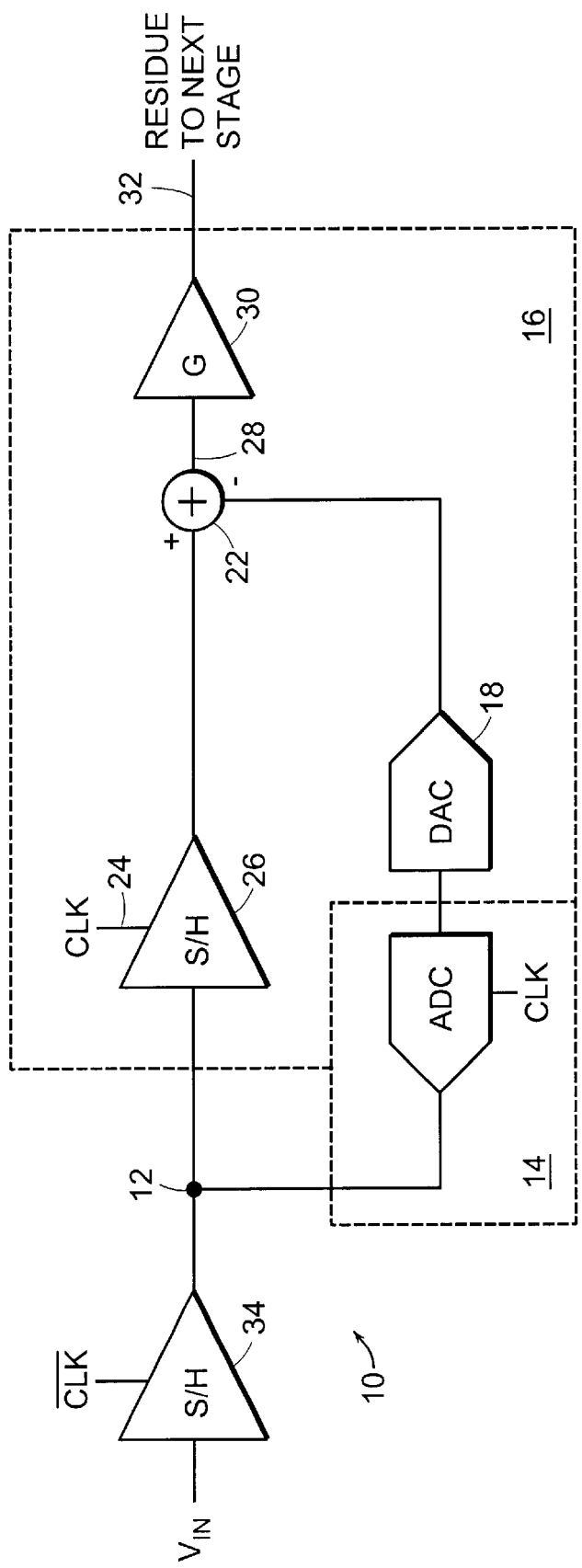
FIG. 2 is a block diagram of a second type of prior art architecture for a residue stage of a typical prior art pipelined ADC.

Turning back to FIG. 4, first stage 62 may, for example, provide three bits of resolution. That is, it may provide coarse quantization that supplies the three most significant bits for the output. Analogously to the prior art approach of FIG. 1, a S/H 72 in the residue generator 66, and a flash converter 74, which provides the quantizer function, are connected in parallel to the input 68 and sample directly the input voltage Vin. More particularly, flash converter 74 includes a number (such as eight) comparators 76-1 through 76-n, each of which has an input connected to the input of the flash converter 74 via a sample-and-hold circuit 77. (The other input of each comparator is connected to a corresponding tap on a resistive voltage divider, not shown, which is driven by a precision voltage reference, also not shown.) Alternatively, and preferably, the function of S/H 77 is moved into each of the comparators 76-i. Thus, the S/H 72 and the comparators 76-i inside the first stage 62 all sample directly the input voltage. The outputs of comparators 76-i together provide a digital control word to a DAC 78 in the residue generator. DAC 78 generates a corresponding analog signal which is subtracted from the input signal Vin to form an error, or residue, signal representing the discrepancy between the generated analog and the input signal. Also, the comparator outputs are decoded by decoder 80, which then supplies (for example) a four-bit (parallel) value on bus 82 to correction logic 84. Thus the DAC 78 generates and holds a residue for the next stage, 89. As explained above, the residue generator may also supply gain (at 92) to scale the residue signal to the next stage's dynamic range.

Although this approach would contribute to aperture errors, particularly in the presence of high frequency signals input, it is possible to obtain good dynamic performance by matching the sampling networks for the (DAC) residue generator and the quantizer comparators in terms of topology and time constants. If both were infinitely fast, there would never be a timing mismatch. But that is not the case, of course.

The price paid for not having a dedicated SHA is more power spent in the op amp and comparators inside the first stage 62 since these elements need to be faster, as discussed in the next section, than would be the case with a dedicated SHA. However, the overall power consumption is reduced significantly since the elimination of the dedicated front-end SHA results in a substantially greater power savings than the minor increase in power consumed by the first stage op amp and comparators.

Figure 5A:
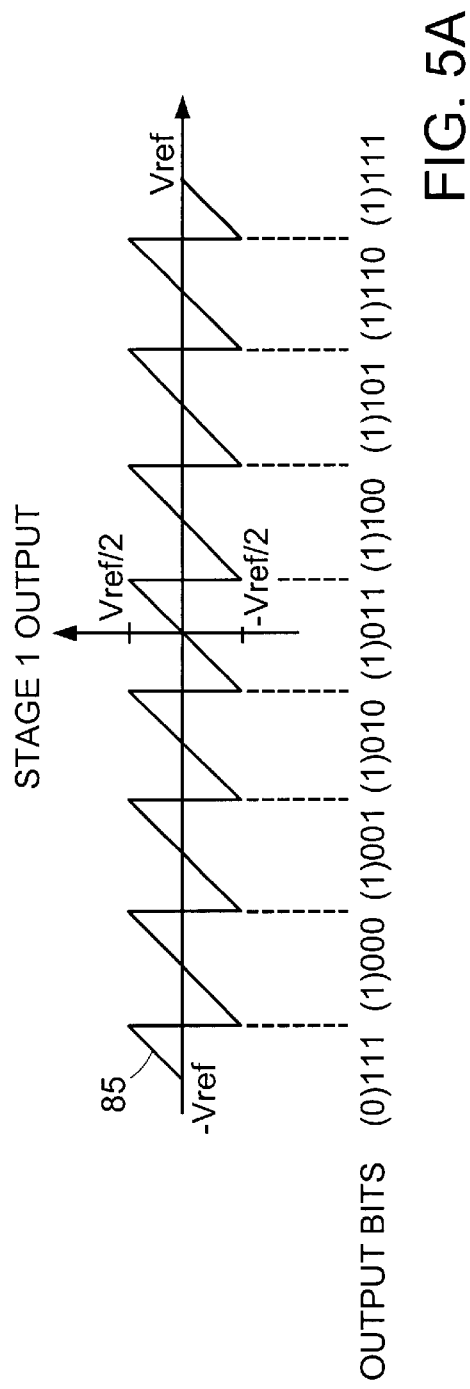
FIGS. 5A and 5B are drawings, respectively, of the transfer functions for the first and the following stages of an ADC according to the invention and as illustrated in FIG. 4.
Figure 5B:
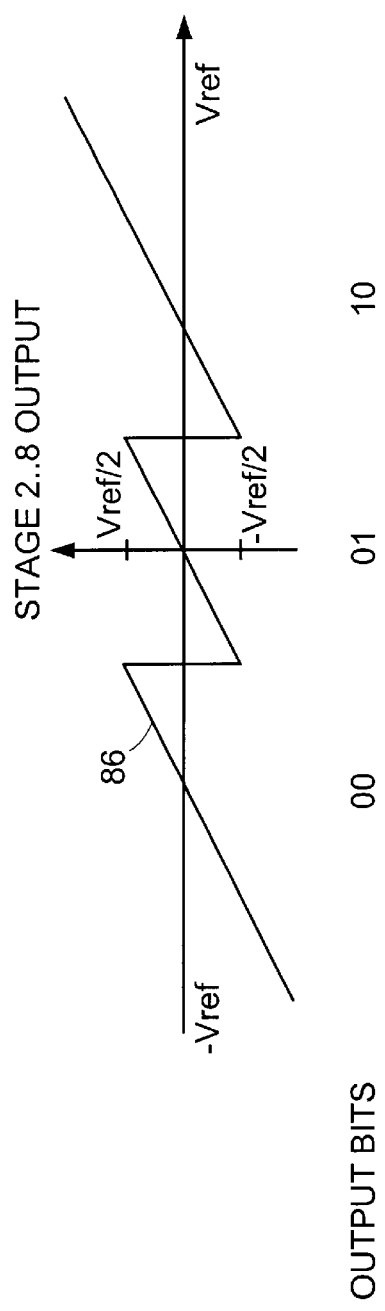

All of the intermediate pipeline stages between the first and last stages provide 1.5-bit (one bit resolved) performance. The first stage 62 is a 3-bit (two bits resolved) stage, and the last stage is a 3-bit flash. This topology provides a good power consumption tradeoff, taking into account the minimum capacitance value to achieve a desired noise floor (capacitors are scaled down the pipeline) and the power consumption of the comparators and the op-amps. The use of 1.5-bit operation for all stages of the pipeline has become increasingly popular, mainly from a power perspective; however, this usually assumes a certain relation between the power consumption in the DAC op-amps and in the comparators. Since in this design the comparators use only a small amount of power, the first stage resolution was increased and the accuracy requirements of subsequent stages was correspondingly reduced. The transfer functions for the first and the following stages are shown in FIGS. 5A and 5B, respectively, at 85 and 86. Also shown below each of the waveforms are representative stage output bits sent to the digital alignment and correction logic 84. First stage 62 generates an extra bit based on having an extra comparator in order to signal the over-range case. As mentioned before, the last stage of the converter is a 3-bit flash, 88.

A 10-bit output code is finally generated by correction logic 84, from the output of each stage's decoder and the flash 88, with a five-clock-cycle latency.

Although not shown in FIG. 4, preferably there is also a bandgap-based generator, which provides the required reference voltages for the DAC and threshold voltages for the comparators (from the voltage divider taps).

Figure 6A:
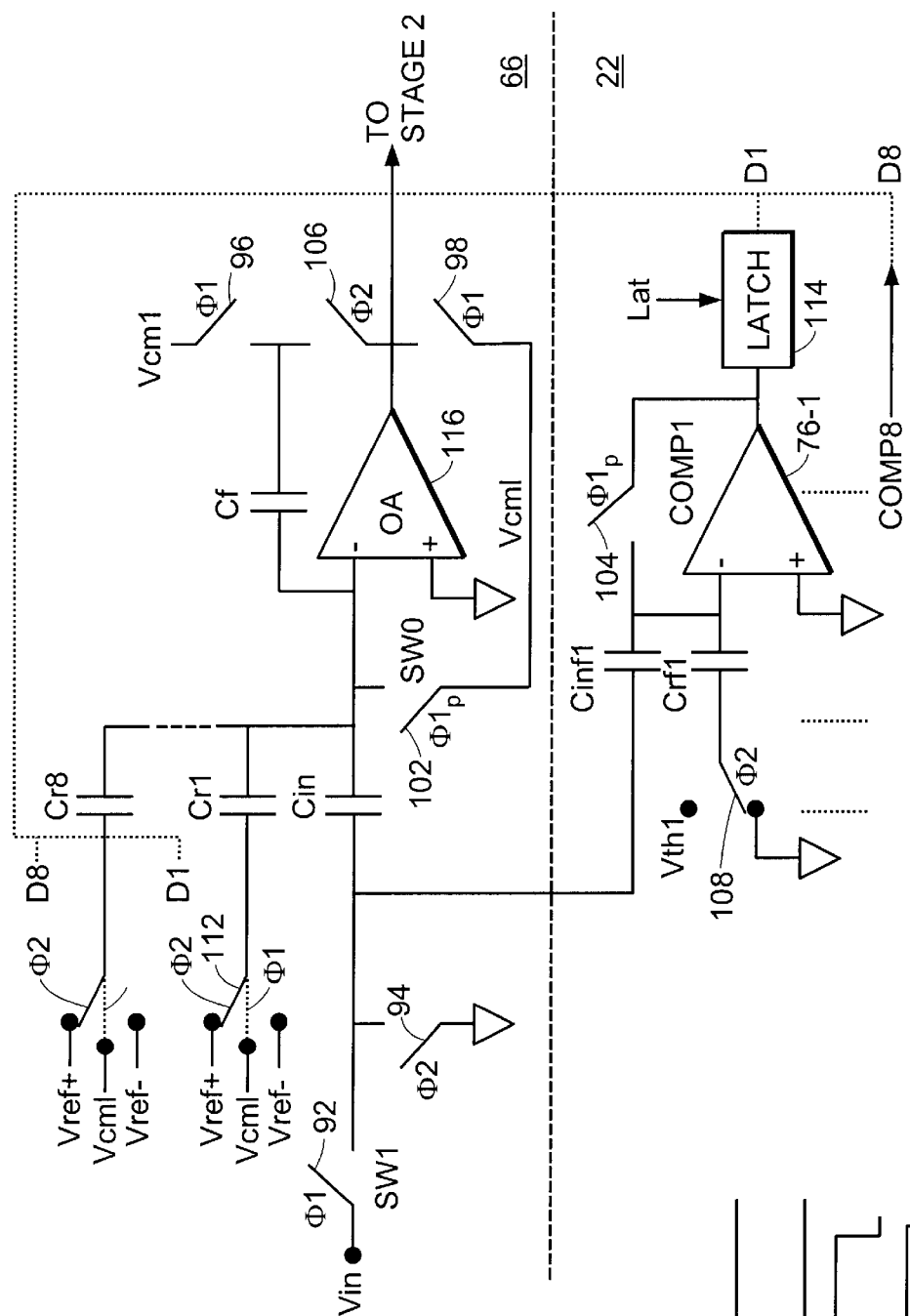
FIG. 6A is a partially-schematic, partially-block diagram of an exemplary arrangement for a stage (e.g., 66) of an ADC according to the invention.
Figure 6B:
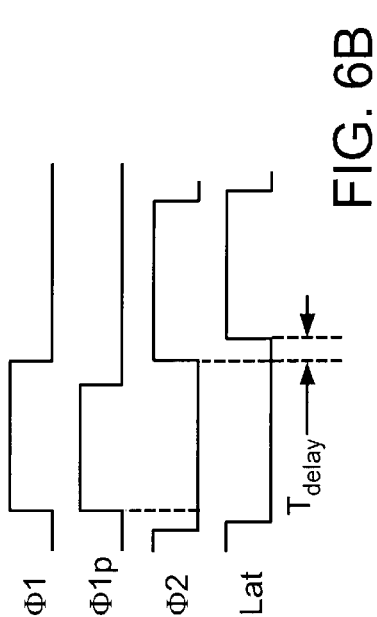
FIG. 6B is a timing diagram for the switch control signals used to operate the stage of FIG. 6A.

Reference is now made to an exemplary arrangement for a stage (e.g., 66) of an ADC according to the invention, as shown in FIG. 6A, with associated switch control signals shown in FIG. 6B. For simplicity, only a single-ended version is represented, although the implementation may be fully differential. The op-amp and switching network comprising residue generator 66 (which exemplifies the residue generator of any stage of the pipeline) is shown on top of one out of the eight flash comparators 76-1, it being understood that the other comparators are similarly configured and connected. During the tracking phase when Φ1p is asserted, switches 92, 96, 98, 102 and 104 are closed and as signal Φ2 is de-asserted, switches 94 and 106 are open; switch 108 is a single-pole, double throw switch thrown to the ground position when Φ2 is asserted and to a reference voltage Vth1 otherwise. At the inverting input node to op-amp 116 there are connected one terminal each of switch 102, input sampling capacitor Cin, feedback capacitor Cf and reference capacitors Cr1 through Cr8. Each of the reference capacitors, such as capacitor Cr1, has another terminal connected to the pole of a single-pole, triple-throw switch 112; one throw is connected to a positive reference voltage, Vref+, one throw is connected to a negative reference voltage, Vref–, and one throw is connected to a common mode voltage, Vcm1. When Φ1 is asserted, switch 112 is thrown to its middle position, connecting to the Vcm1 throw; when Φ2 is asserted and the output D1 of the first comparator 76-1 is high, switch 112 is thrown to the Vref+position; when Φ2 is asserted and the output D1 of the first comparator 76-1 is low, switch 112 is thrown to the Vref– position. In the tracking phase, both capacitors Cin and each of Cinf1 through Cinf8 and are charged and track the input voltage. The sampling operation in the DAC occurs when switch 102 opens on the falling edge of Φ1p. The sample is taken relative to common-mode voltage Vcm1 rather than around the op-amp 116. This does not cancel op-amp offsets, but it also does not require the op-amp to be stable in unity-gain feedback. Offsets at the input of this converter are not a problem for the majority of applications.

The sampling operation inside the flash comparators occurs on the same falling edge of Φ1p when switch 104 opens. At this time, the comparator preamplifiers are also auto-zeroed, as shown in the figure. Separate reference capacitors (Cri in the DAC and Crfi in the flash converter, where i is an index variable) are required to accommodate the input common-mode range. The reference voltages for the comparators are sampled on the falling edge of Φ1, as well. At this moment, the input voltage Vin is sampled and available on capacitors Cinfi, while corresponding reference voltages Vthi are sampled and available on Crfi. After the rising edge of Φ2, the difference Vin–Vthi is sensed at the summing junction at the inverting inputs of the comparators. Meanwhile, the DAC transitions to the amplify phase (while Φ2 is asserted) although the decision from the flash is not available yet. After a short delay (shown in FIG. 6B as $T_{delay}$) from the rising edge of the Φ2 signal, which is necessary to allow the difference between the input and the references to be amplified inside the comparators, the latching signal Lat occurs and the comparator decision outputs D1. D8 become available to the DAC (after the latch 114 regenerates). It can be inferred that this mode of operation requires both the comparator and the DAC op-amp to be faster due to the absence of a dedicated SHA. The comparator needs to be faster in order to make its decision available without taking too much time away from the amplify phase of the DAC. The DAC op-amp needs to be faster due to the delay in availability of the flash decisions, reducing the time available for the amplify phase of the DAC. All this means more power is consumed in the first stage. However, the power saving due to the absence of the dedicated SHA more than compensates for this increase. Another drawback due to the distributed sampling operation is the need for separate reference capacitors Cr1. Cr8, which contribute noise. They also contribute to the reduction of the feedback factor for the DAC op-amp during the amplify phase.

Figure 7:
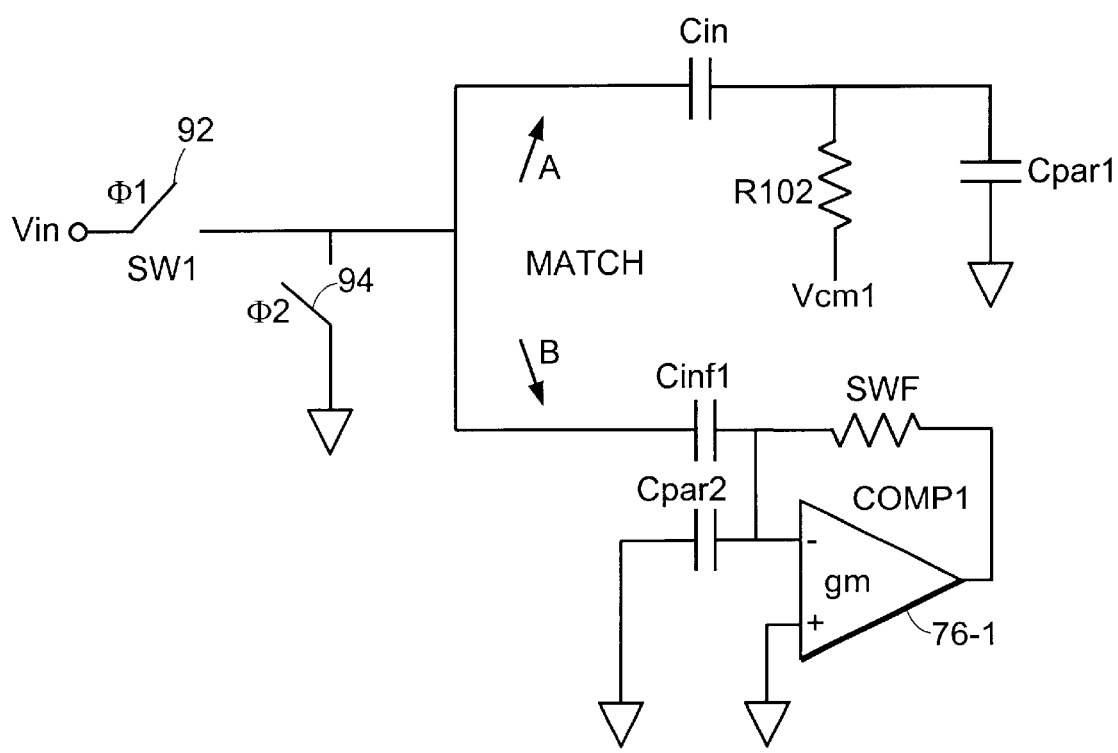
FIG. 7 is a simplified schematic circuit diagram used to illustrate the two sampling networks (i.e., that of residue branch A and that of quantizer branch B) in which matching is needed.

To avoid aperture errors, the sampling networks for the op-amp 116 (i.e., in the residue generator) and for the flash comparators (i.e., the quantizer section) need to provide the same time constants relative to the input. This is shown in FIG. 7, which is a simplified schematic circuit diagram used to illustrate the two sampling networks (i.e., those of residue branch A and quantizer branch B) in which matching is needed. For the implementation shown in FIG. 7, this condition is fulfilled if Cin/Cinf=Cpar1/Cpar2=1/$g_m$R102, where Cin the input capacitors for the DAC and flash comparator, respectively, Cpar1 and Cpar2 are parasitic capacitances connected to the summing junctions, R102 is the on-resistance of the sampling switch 102 in the DAC, and $g_m$ is the transconductance of the comparator preamplifier. Since R102 and $g_m$ are based on geometric and process parameters of similar NMOS devices, it is possible to roughly match the sampling network (accurate matching is difficult due to $V_{gs}$ difference and second-order effects like short channel and device output impedance). Assuming a full-scale sine wave at the input, Vin=Vsin2π$f_{in}$t, the maximum slope is at the origin and that slope is V2π$f_{in}$. A mismatch in the time constant Δτ=ετ results in a voltage error $V_{error}$=V2π$f_{in}$τ. This error needs to be smaller than the correction range of the first pipeline stage; that is $V_{error}$<V/8 in the example, since the first stage flash contains eight comparators (the correction range can be also observed on the transfer function from FIG. 5B). Since the timing signals used to control the sampling are generated inside a unique block, global timing jitter affects the overall converter noise floor but not $V_{error}$. The input sampling networks are designed such that for the maximum input frequency $f_{in}$<0.1/τ. All this translates into a condition for the time constant error of ε<½τ(0.1)(8)≅0.2. Even for a mismatch of 20% in the time constant, the converter would still generate correct data. Simulations showed that the aperture error is small enough to allow operation for input frequencies well above 100 MHz.

Figure 8A:
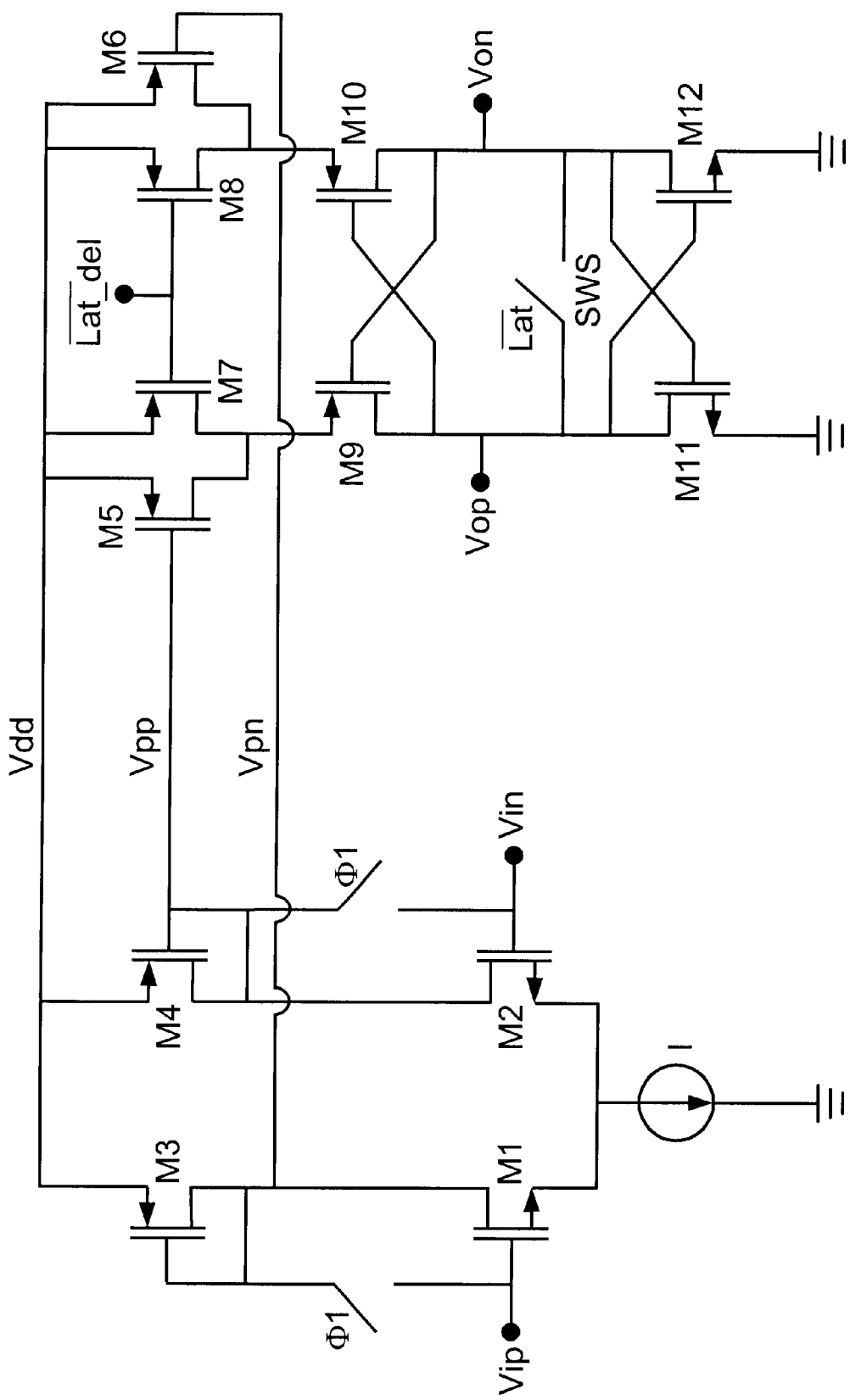
FIG. 8A is a schematic circuit diagram of an exemplary first-stage flash comparator for use in the described example of a pipeline ADC according to the invention.
Figure 8B:
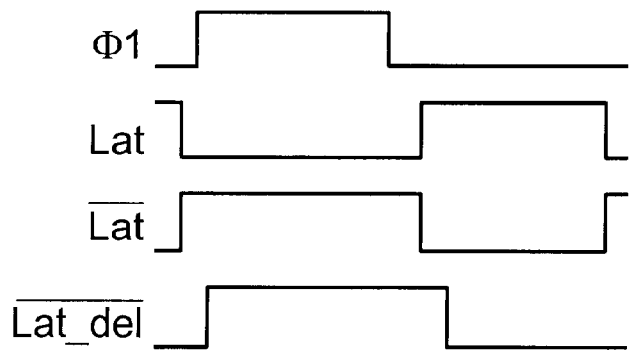
FIG. 8B is a timing diagram for control signals suitable for operating the comparator of FIG. 8A.

The first-stage flash comparators in the illustrated embodiment preferably include a preamplifier followed by a latch, as presented in FIGS. 8A and 8B. The preamplifier consists of an NMOS differential pair M1, M2 driving a PMOS diode-connected load M3, M4, and the auto-zero function is performed around this circuit. The impedance of this preamplifier in closed loop operation is taken into account when matching the sampling network of the comparator to the one for the residue generator, as discussed earlier. Its output is applied to the latch M9–M12, which ultimately generates CMOS levels and drives the switches inside the residue generator as shown in FIG. 6A.

Figure 9:
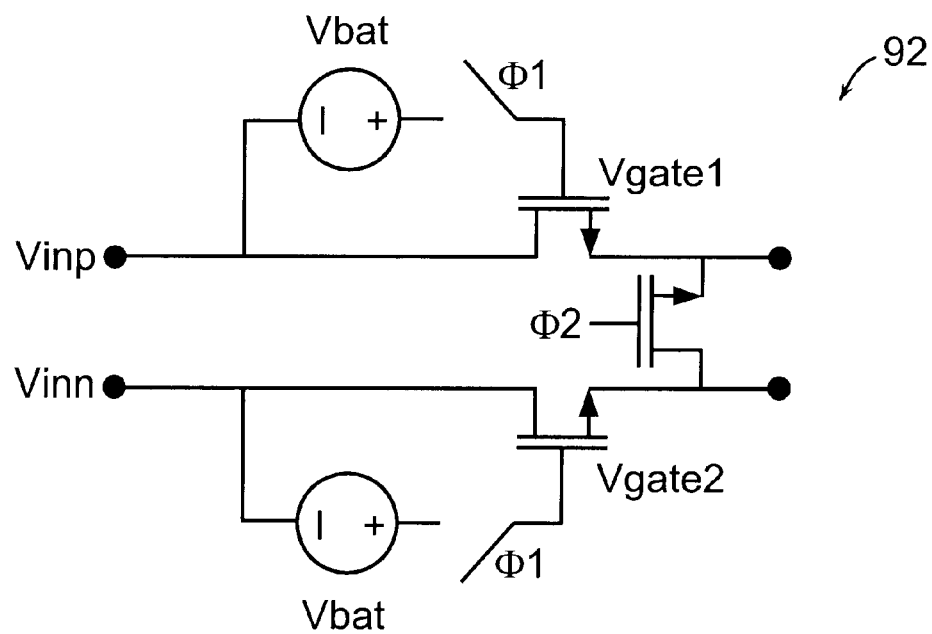
FIG. 9 is a partly diagrammatic, partly simplified schematic circuit diagram for an input switch for the residue generator of FIG. 6A.

In FIG. 6A, the input is presented to the residue generator through a series switch 92. This switch is of NMOS type having the gate driven by a boosted voltage, which is a result of the input's being summed with power supply voltage Vdd, as shown in FIG. 9. When high-frequency input signals are applied, the dynamic performance of the converter is improved by reducing the on-resistance and the nonlinear capacitance associated with 92, and this is achieved using the boosted gate drive referenced above. Note that in the example shown, the input switch 92 is shared between the quantizer and the residue generator, which also helps reduce timing mismatches between those paths.

Having thus explained the inventive concepts and illustrative implementations, it will be apparent that the foregoing embodiments have been disclosed by way of example only, and not to be limiting in any way. Other embodiments and various alterations, improvements and variations of the illustrative examples will readily occur to those skilled in the art. Accordingly, the invention is intended to be limited only by the accompanying claims and equivalents thereto.

We claim:

1. An analog-to-digital converter comprising:

an input to receive an input signal;

a quantizer, coupled to the input, to sample the input signal, and a residue generator, coupled to the quantizer and adapted to separately sample the input signal;

wherein sampling characteristics of the residue generator substantially match sampling characteristics of the quantizer.

2. The converter as claimed in claim 1 wherein a degree of matching of the sampling characteristics is selected at least in part based upon an expected frequency range of the input signal.

3. A method of sampling an input voltage comprising:

using a quantizer, sampling the input voltage; and using a residue generator operatively connected to receive an output from the quantizer, having sampling characteristics substantially matching sampling characteristics of the quantizer, also sampling the input voltage.

4. The method as claimed in claim 3 wherein the sampling characteristics are matched at least in part based upon an expected frequency range of the input signal.

5. An analog-to-digital converter, comprising:

a residue generator;

a quantizer;

each of the residue generator and the quantizer having a sampling network connected to sample a same analog input signal and the sampling networks having substantially matched sampling characteristics;

an output from the quantizer operatively connected to provide an input to the residue generator; and the residue generator being configured and arranged to generate a residue signal from the quantizer output and samples from the residue generator sampling network.

6. The analog-to-digital converter of claim 5 wherein the matched sampling characteristics include the bandwidths of the sampling networks.

7. The analog-to digital converter of claim 5 or claim 6 wherein the matched sampling characteristics include sampling timing.

8. The analog-to-digital converter of claim 5 wherein the quantizer comprises a flash converter having a plurality of comparators, each having one input connected to a respective threshold voltage and one input connected to an output of the quantizer sampling network; and the quantizer sampling network comprising a sample-and-hold circuit for each of said comparators.

9. A pipelined analog-to-digital converter comprising a first stage, one or more intermediate stages each of which receives as input a residue signal output from an immediately preceding stage, a final stage which converts a residue output signal from a next-to-final stage into a corresponding digital signal and correction logic which receives each stage's output and generates a corresponding digital word; and at least the first stage being an analog-to-digital converter according to claim 5 or claim 6.

10. In an analog-to-digital converter having a residue generator, the improvement comprising:

a quantizer;

each of the residue generator and the quantizer having a sampling network connected to sample a same analog input signal and the sampling networks having substantially matched sampling characteristics;

an output from the quantizer operatively connected to provide an input to the residue generator; and the residue generator being configured and arranged to generate a residue signal from the quantizer output and samples from the residue generator sampling network.

11. The analog-to-digital converter of claim 10 wherein the matched sampling characteristics include the bandwidths of the sampling networks.

12. The analog-to-digital converter of claim 10 or claim 11, wherein the analog-to-digital converter is selected from among a pipeline converter, a cyclic converter, a pipeline sigma-delta converter, an error-correcting successive approximation converter, and a two-step converter.

* * * * *